(12) United States Patent
Burgess et al.

(10) Patent No.: US 7,621,219 B2
(45) Date of Patent: Nov. 24, 2009

(54) METHOD AND APPARATUS FOR REGISTRATION OF AN IMAGED LITHOGRAPHIC PLATE

(75) Inventors: Dennis M. Burgess, Wayzata, MN (US); William J. Campbell, Minetonka, MN (US); Joseph A. Stein, Plymouth, MN (US)

(73) Assignee: Burgess Industries, Inc., Plymouth, MN (US)

( * ) Notice: Subject to any disclaimer, the term of this patent is extended or adjusted under 35 U.S.C. 154(b) by 21 days.

(21) Appl. No.: 11/752,839

(22) Filed: May 23, 2007

(65) Prior Publication Data

US 2007/0283831 A1 Dec. 13, 2007

Related U.S. Application Data

(60) Provisional application No. 60/808,872, filed on May 26, 2006.

(51) Int. Cl.
*B41F 1/34* (2006.01)
(52) U.S. Cl. .................................. 101/481; 101/382.1
(58) Field of Classification Search ................. 101/481, 101/382.1
See application file for complete search history.

(56) References Cited

U.S. PATENT DOCUMENTS

| | | | | |
|---|---|---|---|---|
| 4,489,652 A | * | 12/1984 | Takeuchi et al. | 101/211 |
| 4,797,714 A | * | 1/1989 | Bujese | 355/77 |
| 4,867,296 A | * | 9/1989 | Volna | 198/345.3 |
| 5,156,091 A | * | 10/1992 | Batz | 101/415.1 |
| 5,255,607 A | * | 10/1993 | Nishiyama et al. | 101/463.1 |
| 5,970,774 A | * | 10/1999 | Burgess et al. | 72/294 |
| 6,016,752 A | * | 1/2000 | Harari | 101/486 |
| 6,510,793 B1 | * | 1/2003 | Kerr et al. | 101/382.1 |

* cited by examiner

*Primary Examiner*—Anthony H. Nguyen
(74) *Attorney, Agent, or Firm*—Thomas J. Nikolai; Nikolai & Mersereau, P.A.

(57) ABSTRACT

The method and apparatus for registration of a lithographic plate includes a means for ensuring that the plate is in contact with registration pins on imaging and bending devices and a means for finely adjusting an initial position of the plate with respect to registration pins on the bender to bring the plate in registration with the specified plate lock-up position on the press cylinder. Three separate electrical circuits ensure that the plate is in contact with the registration pins if each separate circuit is able to conduct current between the respective pins and the plate. The fine adjustment is accomplished by rotation of eccentric registration pins until the plate is within tolerance.

16 Claims, 8 Drawing Sheets

METHOD AND APPARATUS FOR REGISTRATION OF AN IMAGED LITHOGRAPHIC PLATE

CROSS REFERENCE TO RELATED APPLICATION

This application claims the benefit of U.S. Provisional Patent Application Ser. No. 60/808,872 filed May 26, 2006.

FIELD OF TECHNOLOGY

The technology disclosed in this specification is in the field of registration of an imaged lithographic plate for mounting on a corresponding press cylinder. More particularly, the technology embodies an imaging device and a plate bending device by which the registration method can be practiced.

BACKGROUND

FIG. 1 illustrates a prior art method of registration of a lithographic plate with an imager, plate bender, and press cylinder. The continuity of registration is maintained from the imaging device, to the bender device, and to the emplacement of the plate on a press cylinder.

The plate bender often performs a punching function, as well as the bending function. But the plate bending function and the plate punching function can be performed by separate devices.

The terms plate bender, bender, plate punch/bender, or similar nomenclature means a device that performs both the punching and the bending function; a separate device for performing the punching function; and a separate device for performing the bending function.

The prior art lithographic imaging device uses three points of contact (i.e., three fixed pins) for positioning a lithographic printing plate on the imager. See FIG. 1 at -A-. The plate is positioned in contact with the locations of each of the three fixed pins prior to imaging, but due to out of tolerance issues and other issues this does not always happen. See FIG. 1 at -B-. Once the plate is positioned firmly against the fixed pins, the plate is imaged. See FIG. 1 at -C-. Registration is created by the relationship of the image on the plate to the three fixed pins on the imaging device. This results in an image that is square with respect to the three fixed pins and parallel to the two fixed pins that reside on one edge of the imaged plate.

After the plate has been imaged, a punch/bender device positions the plate on the punch/bender by bringing the plate into contact with three fixed pins on the punch/bender. The relative locations of the fixed pins on the punch/bender are substantially the same as the relative locations of the fixed pins on the imaging device. See FIG. 1 at -D-. The imaged plate is positioned against the three fixed pins until the plate is in register (i.e., in contact with the three fixed pins). The image is square to the pins and it is in the same register position as it was in the imaging device, thereby creating continuity of register within 0.001 inch. See FIG. 1 at -E-. After the imaged plate is brought into contact (i.e., in register) with each of the three pins, the punch/bender punches and bends the plate. The result is an image that is square to the bend and is in register with the press manufacturer's specifications. See FIG. 1 at -F-.

Register requires the image to be substantially square to the formed bends and notch locations on the plate. See FIG. 1 at -G-. The continuity of register becomes the relationship between the image to the formed bends and register notch locations required by the press manufacturer. See FIG. 1 at -H-. The lead and tail bends must be straight and parallel with each other for maximum plate on press register and performance. See FIG. 1 at -I-.

The foregoing registration system provides relatively accurate registration for most printing applications. However an embodiment of a back-up system described in this specification provides (i) verification of image register tolerance, (ii) fine adjustment of the position of the plate if its registration falls outside the tolerance limits of the press manufacturer, and (iii) ensurance that the plate is in contact with all three pins.

SUMMARY

An embodiment of the process of registration of a lithographic plate begins with placing the plate on an imaging device. A first edge of the plate is positioned in contact with one fixed registration pin on the imaging device and a second edge adjacent the first edge of the plate is positioned in contact with two fixed registration pins on the imaging device. The three fixed registration pins on the imaging device are in locations on the imaging device that are substantially the same as the relative locations of the manufacturer's specified plate lock-up position on a corresponding press cylinder. An operator of the imaging device or a computing device such as a PLC receives an indication that the plate is in contact with all three registration pins and signals the imaging device to image the plate. If on the other hand the plate is not in contact with all three registration pins the PLC, for example, signals the imaging device to move the plate into contact with all three registration pins. Upon sensing full contact between the plate and each of the three pins, the imaging device images the plate. Plate contact with all three fixed registration pins establishes registration between the image and the three fixed registration pins. The imaged plate is transported to a lithographic processor and the image is processed. Another phase of the embodiment of the process of registration begins with transporting the imaged plate to a bending device. The bender extends three eccentric rotatable registration pins above a bed on the bending device. A first edge of the plate is meant to be positioned in contact with one eccentric rotatable registration pin and a second edge adjacent the first edge of the plate is meant to be positioned in contact with two eccentric rotatable registration pins on the bending device. The three eccentric rotatable registration pins are also meant to be in locations that are substantially the same as the relative locations of the fixed registration pins on the imaging device. However, three point contact may not occur and the registration pins may be in locations that are not substantially the same as the relative locations of the fixed registration pins on the imaging device. These conditions may be due to, for example, out of tolerance pin sizes or pin locations. The condition of failure to contact the plate with all three pins is corrected by sensing that there is a full contact, or an out of contact, condition. In an out of contact condition, the plate is moved into full contact. After full contact is achieved, a sensing device senses whether the registration pins may be in locations that are not substantially the same as the relative locations of the fixed registration pins on the imaging device. If this condition exists, the eccentric rotatable registration pins are rotated and the plate is thereby moved from its initial position to another position that brings the image on the plate into registration with the manufacturer's specified plate lock-up position on the press cylinder. After the plate is in registration, the three eccentric rotatable registration pins are retracted below the bed of the bending device. The bending device then punches and bends the imaged plate and the bent and punched plate is transported to the press cylinder.

The apparatus for determining whether the lithographic plate is in contact with the pins on an imaging or bending device is a sensor circuit. The circuit has a source of current connected to a registration pin and to a lithographic plate. Current flows through the circuit when the plate is in contact with the pin. And does not flow when the plate is not in contact with the pin. In most cases the sensor is comprised of three pins each pin having a separate circuit. Current flow in each circuit must be detected prior to generation of a signal that triggers the imager or bender to initiate an operation. If current is not detected in each separate circuit, a signal is generated to the imager or bender to move the plate into contact with each of the pins. Two robotic grippers on each side of the plate are often used to move the plate under the direction of a vision system.

A system for correcting positional errors of the plate on a bender with respect to a target position uses eccentrically rotatable pins that are in contact with a plate on the bed of a bending device. The rotatable pins are in substantially the same relative positions as the pins of an imaging device. Consequently, the eccentrically rotatable pins may rotated to move the plate in register with specified tolerances of a press cylinder. The system has three pins, one of which is for contact with a first edge of the plate and the other two of which are for contact with a second edge of the plate, the first and second edges adjacent one another. Each pin has a shaft offset from a central axis, an upper shaft extension in line with the central axis, a drive means for rotating the shaft and the upper extension of the shaft, whereby each pin is eccentrically rotated. Alignment marks are in registration with fixed pins of the imaging device, the alignment marks are indicative of a targeted plate position relative to an out of register plate position on the bed of the bending device. The targeted plate is positioned in contact with the upper shaft extensions. One or more cameras scan the alignment marks, compare the alignment marks to the targeted position, and indicate an in-register, or out of register, plate position when the target plate position is respectively inside, or outside, of the alignment marks. Separate cameras scan each alignment mark. The plate is moved from an out of register position to an in register position by rotation of the upper shaft extensions until the plate alignment marks are positioned in-line with the targeted plate position. Each pin is moveable in clockwise or counter-clockwise rotation and each pin is rotable independently of the other pins. There is a means for extending and retracting the pins above and below the bed of the bender. The process corrects an out of register position of the plate with respect to the target position of the plate by determining the extent of the out of register plate position based upon camera images of the position of the plate relative to the alignment marks, calculating error corrections to move the plate into register, sending independent error correction signals to each pin, and rotating each pin in accordance with its respective error correction signal. One or more iterations of the process is performed until the error is corrected and the plate is in register. Prior to commencing a new cycle of correction the pins must be rotated from pin correction positions back to home pin positions. The process can use a triangulation algorithm to calculate error corrections.

DESCRIPTION OF EMBODIMENTS

Alignment, i.e. registration, of the plate on the press cylinder is critical. In fact, high rotational speed printing operations often require a registration tolerance within 0.001 of an inch. In the final analysis, it is the image on the plate relative to the press manufacturer's specified plate lock-up position on the press cylinder that must be "square."

There are two important steps during pre-press preparation of a plate, each of which can cause the image to be out of square when the plate is locked-up on the press. The two steps are shown in FIG. 2 at A through D, an embodiment of three point plate registration system 22.

Figure 1:
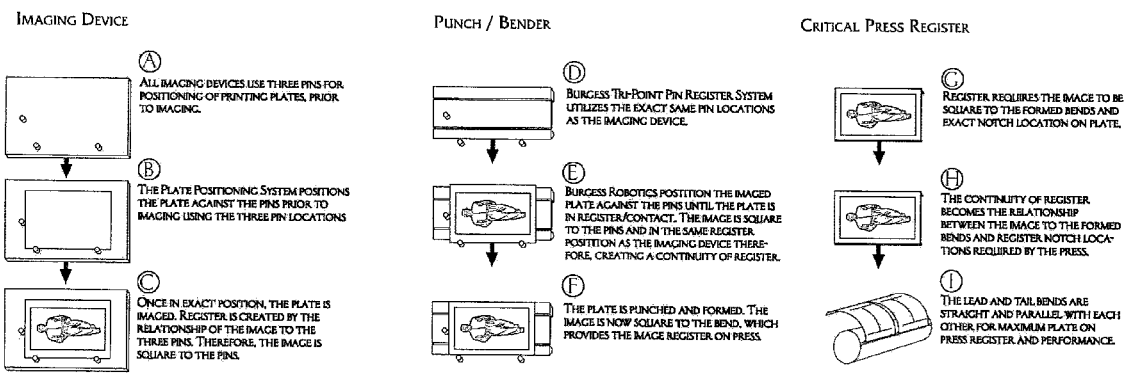
FIG. 1 is a description of a prior art registration system.
Figure 2:
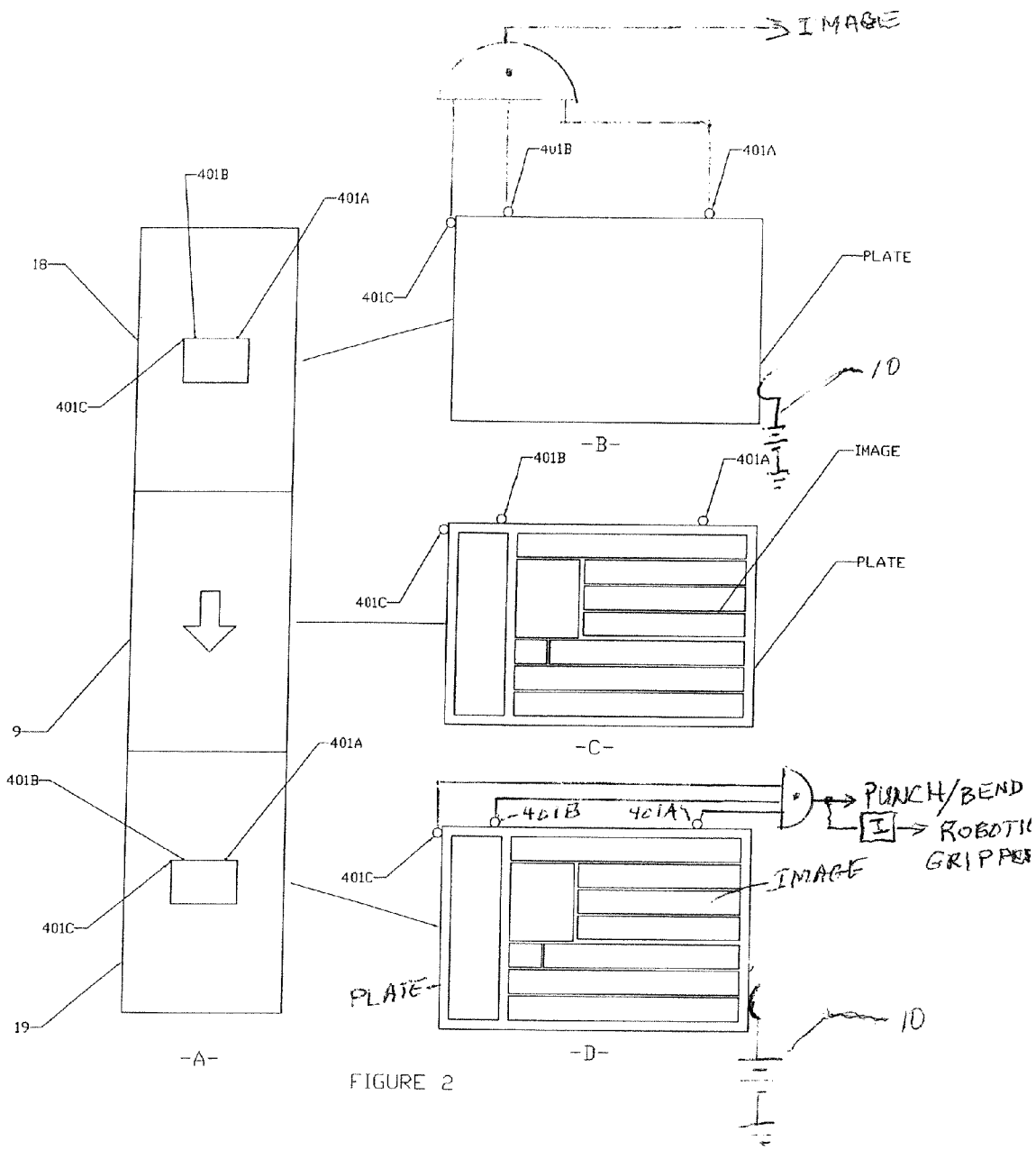
FIG. 2 is a plan view of an embodiment of three point plate registration system.

The first step is positioning the plate against the three, stationary registration pins 401A, B, and C on imager 18 and then imaging the plate, as shown in FIG. 2 at A through C. Prior to implementation of the second step, the imaged plate is transported by a belt transporter or by hand from imager 18 to lithographic processor 9, which processes the image. After processing, the plate is transported to punch/bender 19. In the second step, punch/bender 19 bends and notches the imaged plate in a manner that will ensure the image on the plate remains in registration with the three registration pins 401A, B, and C of imager 18, as shown in FIG. 2 at A through D. In other words, continuity of location of the image on the plate relative to imager's three registration pins 401A, B, and C during the punching/bending operation is imperative.

Prior to imaging, the plate is positioned on imaging module 18 by placing it in contact with the imager's three fixed registration pins 401A, B, and C. FIG. 2 at A through C. Once firmly in contact with the three fixed registration pins 401A, B, and C, the plate is imaged. Therefore, registration is established by the relationship between the image and the three pins 401A, B, and C.

As shown in FIG. 2 at D, punch/bender 19 also uses substantially the same three registration pin locations 401A, B, and C as does imaging module 18, thereby maintaining continuity of the register relationship between the image and the three pins 401A, B, and C. Registration of the image on the plate with the punch/bender module 19 is dependent upon the proper location of the plate relative to the three pins 401A, B, and C of punch/bender module 19. The imaged plate is positioned in contact with the three pins 401A, B, and C on punch/bender 19, as was done with imaging module 18. Registration is accomplished, when the image is square with the three pins 401A, B, and C on the punch/bender 19. Normally, the image will be in registration when the plate is firmly positioned against all three of the registration pins 401A, B, and C. However, in some cases the initial position of the plate with respect to pins 401A, B, and C needs fine adjustment to bring the image into registration within the requisite press manufacturer's tolerance, typically of 0.001 inches. As previously mentioned, the goal is to create and maintain continuity of registration between the image and pins 401A, B, and C. Achievement of fine adjustment is accomplished by a mechanism for moving pins 401A, B, and C. After registration on the punch/bender 19, the imaged plate is notched and bent so that the image is square to the bend and the notch and in registration with the manufacturer's specified plate lock-up position on the press cylinder. Registration of the imaged plate and the bent and notched imaged plate must be identical to each other, within the foregoing tolerance, and both must be identical to the manufacturer's specified plate lockup position on the press cylinder.

In an embodiment, a back-up system is employed to doubly ensure that the plate is in contact with all imager 18 and/or punch/bender 19 pins 401A, B, and C. The back-up system wires each pin 401A, B, and C and the plate to a source of current 10. Each pin-plate combination has its own separate circuit. A current will flow between a pin 401A, B, or C and the plate, if the plate is in contact with the pin 401A, B, or C. If, and only if, the plate is in contact with all three pins 401A, B, and C will a current flow between each pin and the plate. If this does not occur, the plate will not be imaged until it is moved in contact with all of the pins 401A, B, and C and the imager 18 indicates that current flow exists between each pin 401A, B, and C and the plate. This same system may also be used on the punch/bender 19.

Figure 3:
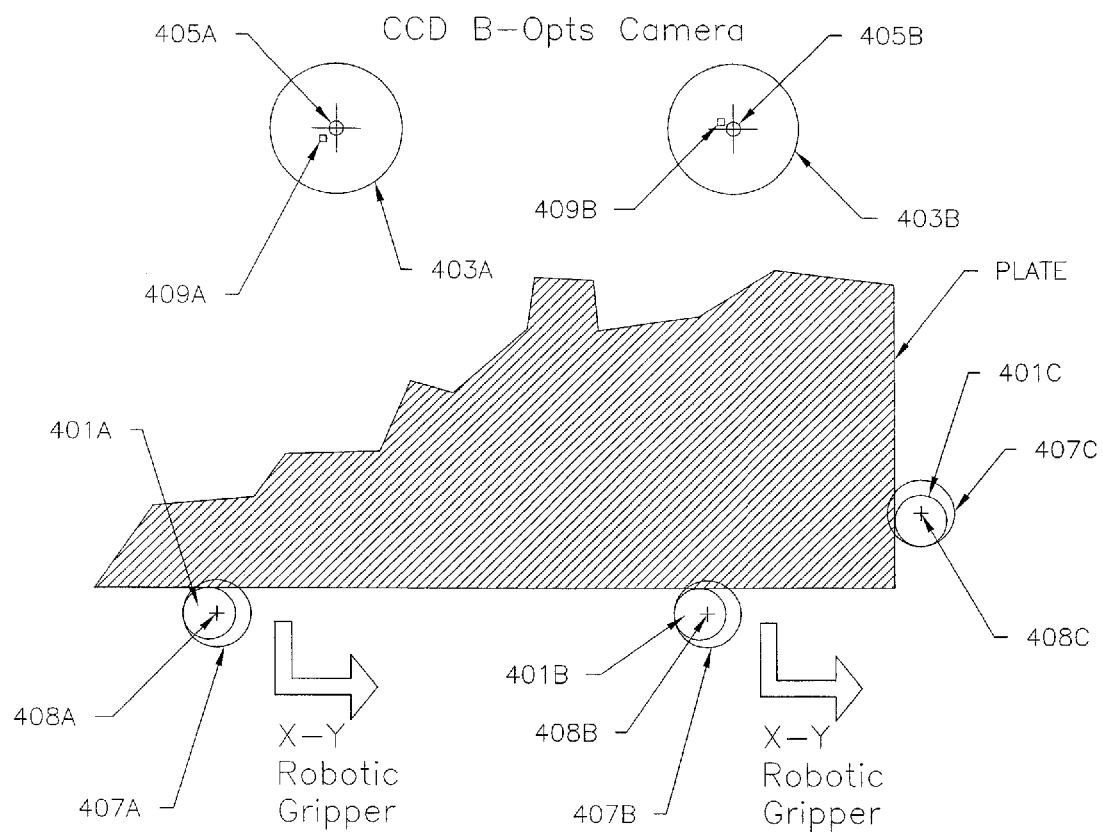
FIG. 3 is a schematic view of a plate positioned for registration in an embodiment of the three point plate registration system.
Figure 4:
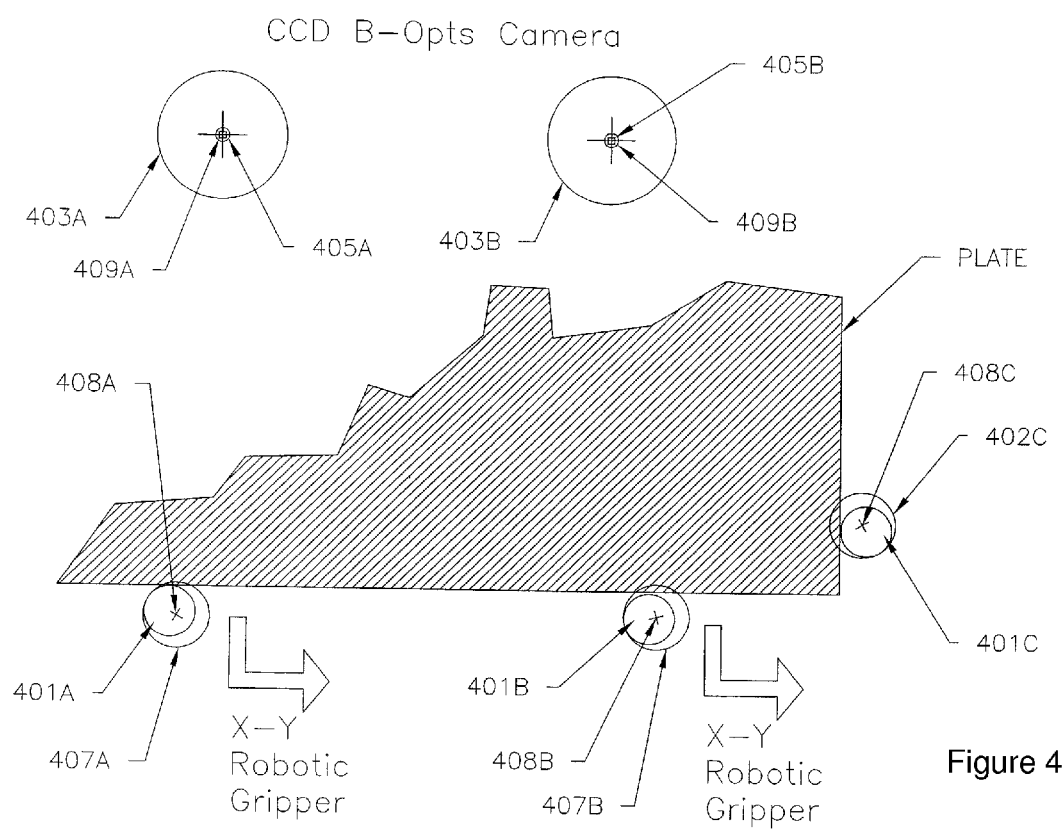
FIG. 4 is a schematic view of a plate after registration in an embodiment of the three point plate registration system.
Figure 5:
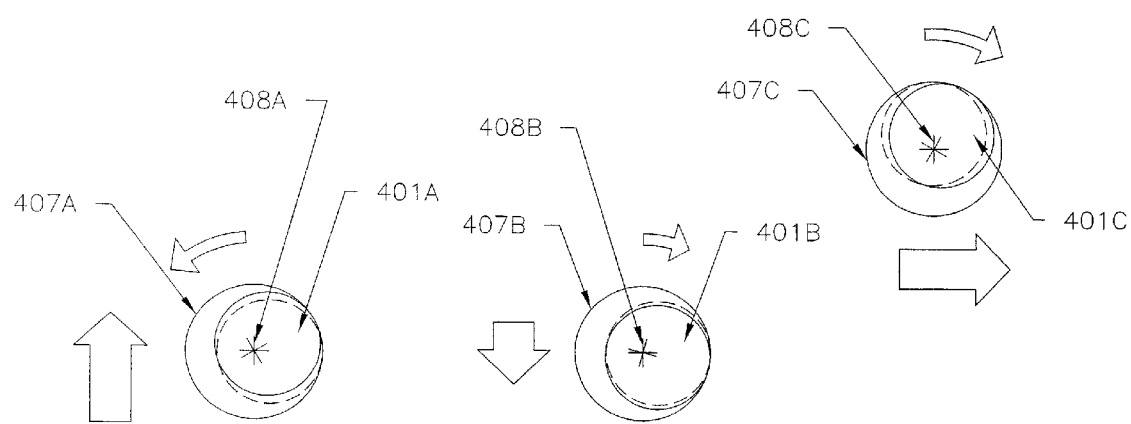
FIG. 5 is a schematic view of the movement of pins in the embodiment of FIG. 3.

FIGS. 3, 4, and 5 illustrate an embodiment of the three point pin registration system 22. This embodiment is comprised of rotatable pins 401A, B, and C on punch/bender 19. In contrast, the pins 401A, B, and C of imager 18 are stationary. The punch/bender's rotatable pins permit fine adjustment of the plate to obtain repeatable registration within the press manufacturer's tolerance limits. The moveable pin system is another back-up system to doubly ensure that the image remains in registration. It emulates the three pin system used by imager 18 with the exception that pins 401 of punch/bender 19 rotate eccentrically for making fine adjustments to the plate orientation. Each pin in punch/bender 19 is in the same location relative to the three pins of imager 18. FIG. 3 is a diagrammatic illustration of a plate positioned for registration on punch/bender 19. FIG. 4 is a diagrammatic illustration of the embodiment of FIG. 3 after registration. FIG. 5 is a diagrammatic illustration of the movement of pins 401A, B, and C of plate registration system 22.

The three pins 401A, B, and C extend above the level of the bed of punch/bender module 19, when in use. When not in use, pins 401A, B, and C are retracted below the level of the bed.

Figure 6:
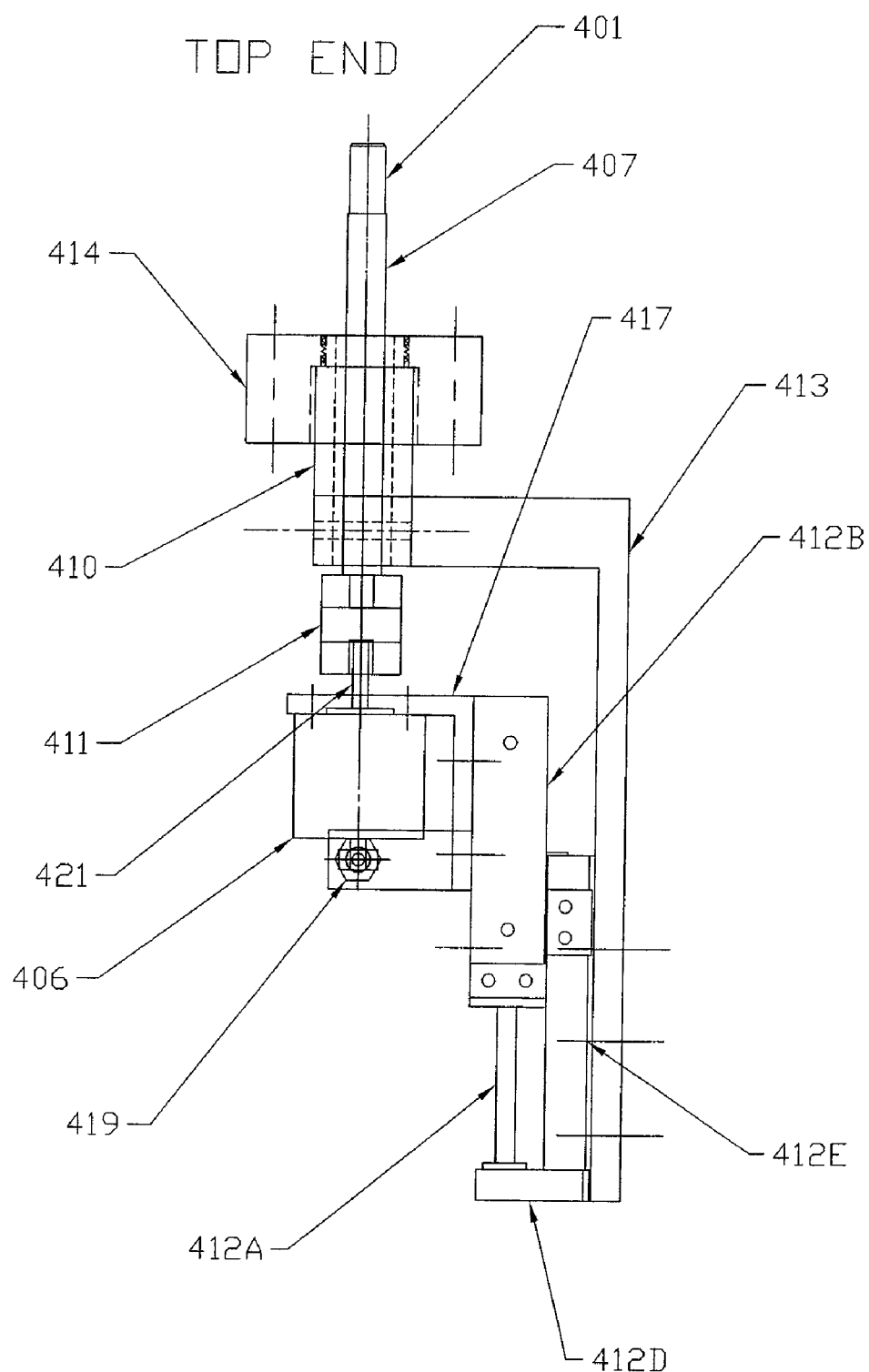
FIG. 6 is a elevation view of an embodiment of a registration pin assembly in a pin up position.

The plus sign ("+ sign") in FIGS. 3, 4, and 5 represents the location of central axis 408A, B, and C of pin shafts 407A, B, and C (FIG. 6 also shows the pin shafts). Pin shafts 407A, B, and C are driven by drive motors 406A, B, and C (FIG. 6). Drive motors 406A, B, and C are mounted below the level of the bed of punch/bender 19. Eccentric registration pins 401A, B, and C are an upper extension of pin shafts 407A, B, and C. Eccentric registration pins 401A, B, and C are rotated eccentrically by pin shafts 407A, B, and C. Eccentric registration pins 401A, B, and C rotate eccentrically due to their off-set from central axis 408A, B, and C of pin shafts 407A, B, and C. Pin shafts 407A, B, and C are in-line with central axis 408A, B, and C and are, therefore, rotating concentrically with central axis 408A, B, and C.

Figure 8:
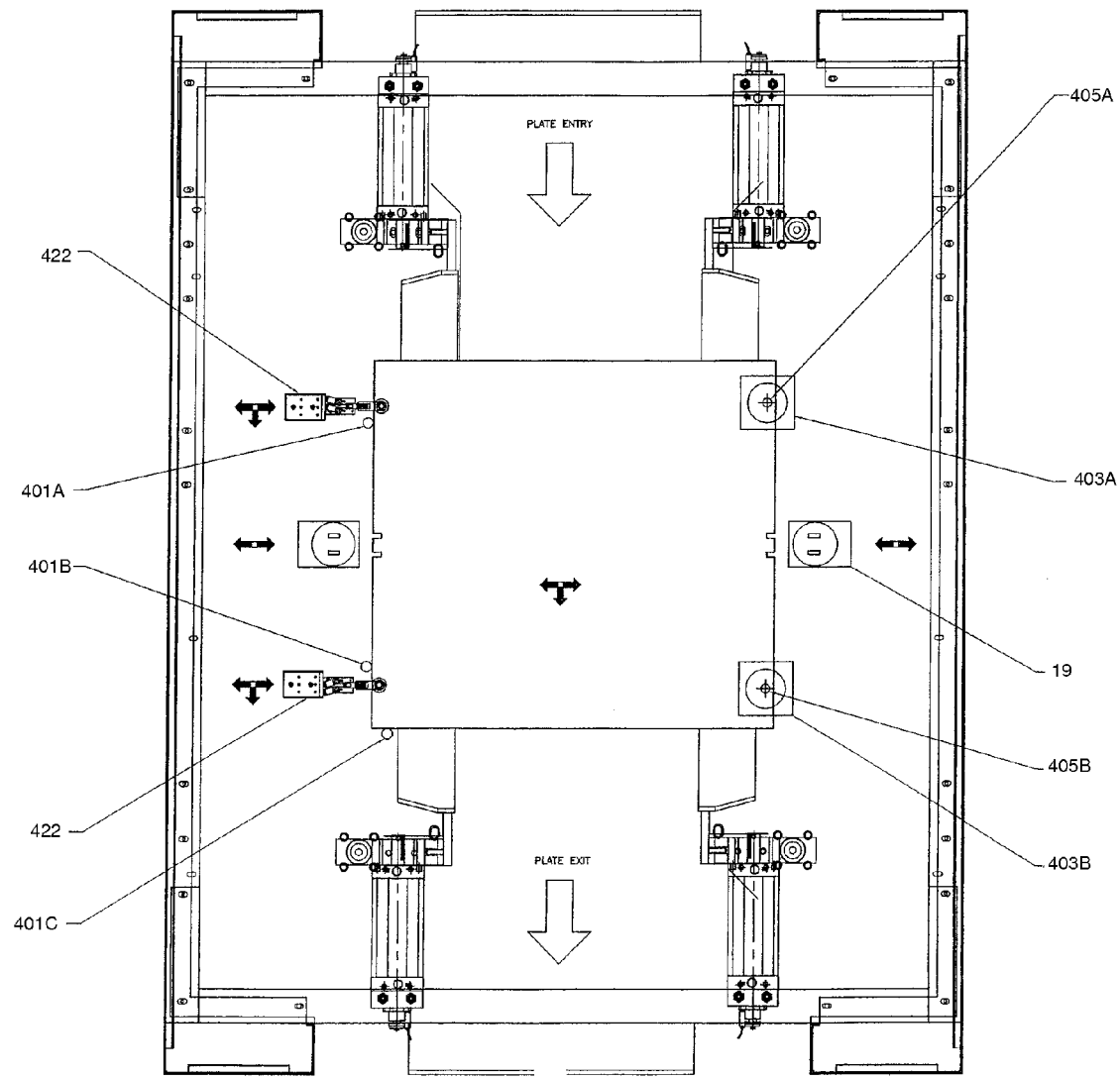
FIG. 8 is a plan view of an embodiment of the three point plate registration system in the context of a punch/bender.

In FIGS. 3 and 8, alignment marks 405A and B (shown as circles on FIGS. 3-5) are used to indicate the desired target position of the plate relative to the initial position of the plate with respect to its contact with each of pins 401A, B, and C of punch/bender 19. Alignment marks 405A and B are placed on the lithographic plate during imaging by imager 18. Alignment marks 405A and B are in registration with the imager's pins 401A, B, and C. Cameras 403A and B on punch/bender 19 scan alignment marks 405A and B on the positioned plate and compare the alignment marks 405A and B with targets 409A and B (shown as squares on FIGS. 3-5). An in-registration position is indicated when target squares 409A and B are inside alignment mark circles 405A and B. The comparison, reveals that the initial position of the plate (indicated by alignment marks 405A and B) is some slight distance from pre-determined target positions 409A and B. This means that the plate is not in registration with pre-determined target positions 409A and B. Therefore, a correction is made to the plate position shown in FIG. 4. The correction is made by slight rotation of eccentric pins 401A, B, and C by drive motors 406A, B, and C. Rotation of pins 401A, B, and C moves the plate's position until plate alignment marks 405A and B are positioned in-line with the target positions 409A and B. The slight rotation of pins 401A, B, and C can be seen by comparison of the + signs in FIGS. 3 and 4. In FIG. 3, one of the bars of the + signs is horizontal and the others are vertical. After correction as shown in FIG. 4, the + sign for pin 401A has rotated counterclockwise approximately 30°, the + sign for pin 401B has rotated clockwise approximately 30°, and the + sign for pin 401C has rotated clockwise approximately 45°.

FIG. 5 more clearly illustrates the movement of the plate from an initial out-of-register position in FIG. 3 to an in-register position in FIG. 4. Dotted line circle in FIG. 5 indicates the initial out-of-register position of pins 401A, B, and C and the solid line indicates the in-register position. The circular arrow segments indicate the clockwise or counter-clockwise direction of pins 401A, B, and C, as the case may be. The straight arrow segments indicate the direction of movement of the plate as a result of rotation of eccentric pins 401A, B, and C.

The plate registration system rotates each pin 401A, B, or C on the punch/bender module 19 independently of the other pins on that module.

The system may use an iterative process wherein the images from cameras 403A and B of target positions 409A and B relative to alignment marks 405A and B on the plate 405A an B are used to calculate out-of-registration errors and, based upon the out-of-registration errors, calculate error correction signals using a triangulation algorithm. System22 The s stem feeds back independent error corrections to each independent drive motor 406A, B, and C and each independent drive motor eccentrically rotates its associated pin 401A, B, and C a number of degrees commensurate to its correction error signal. This sequence is followed by another iteration of the sequence until the error correction approaches -O- at which time the plate is in registration. Error correction signals may be sent to pin motors 406 in the form of a number of pixels needed to correct the error. If the motor 406 is a stepper motor, the number of pixels is translated into the number of rotational steps (or the number of degrees the motor must turn if it is not a step motor) the stepper motor must take to move the plate into an in-registration position. Other forms of signaling may be used to accomplish the same goal as well as other forms of drive motors.

Figure 7:
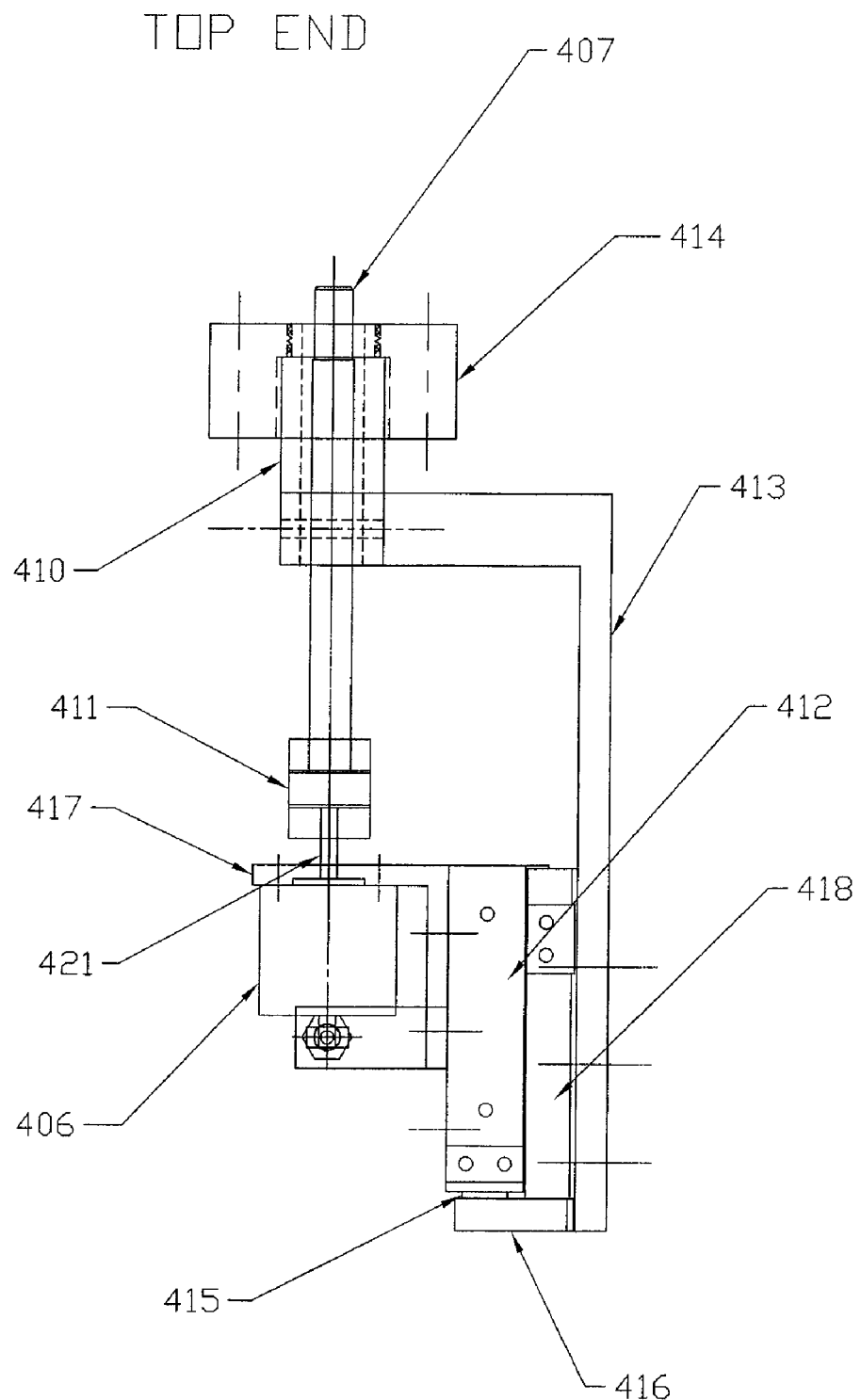
FIG. 7 is a elevation view of an embodiment of a registration pin assembly in a pin down position.

FIGS. 6 and 7, respectively, illustrate registration pin assembly 420 in a "pin-up" position and a "pin-down" position. Registration pin assembly 420 is affixed to punch/bender module 19 by assembly mounting bracket 413. Pin assembly 420 is also affixed to the punch/bender module 19 by stop block 414. Dual rod cylinder assembly 412A is responsible for moving pins 401A, B, or C upwardly and downwardly. When dual rod cylinder assembly 412A is signaled by system 1 to move its associated pin 401A, B, or C into the up position, a pneumatic system on punch/bender 19 pumps air into dual rod cylinder 412B and raises its associated pin 401A, B, or C. When dual cylinder 412B is signaled to return to the down position, a port opens the cylinder to the atmosphere and relieves the air pressure thereby allowing its associated pin 401A, B, or C to move to the down position. Dual rod cylinder assembly 412A has both dual cylinders 412B and dual rods 412C. Air cylinder 412B is a moving part and cylinder rods 412C are stationary parts. Cylinder rods 412C are affixed to stationary platform 412D. When air cylinders 412B are actuated they move upwardly by pushing against stationary cylinder rods 412C. Air cylinders 412B are slidably engaged for vertical movement within slide 412E. Drive motor 406 is attached to motor bracket 417, which is attached to movable dual rod cylinder 412B. Motor shaft 421 is fixedly connected within the lower end of coupler 411 and pin shaft 407 is connected within the upper end of coupler 411. Pin shaft 407 is journaled in bearing housing 410, the top of which extends into stop block 414 where bearing housing 410 is fixedly engaged, i.e., bearing housing 410 does not rotate. To cause its associated pin 401A, B, or C to retract, i.e., move down, cylinders 412B are opened to the atmosphere and it slides down slide 412E and rods 412C are retracted into cylinders 412B and the pins 401A, B, or C follow.

If a pin 401A, B, or C is rotated a number of degrees it must rotate back to its home position before beginning a new cycle of fine adjustment of the previously adjusted plate or another plate. A proximity sensor 419 is used as a homing device for accomplishing this task.

Grippers 422 may be used to move the plate on imager 18 bed or on the punch/bender 19 bed. Grippers 422 are particularly useful to make positive contact between the plate and each of the three pins 401A, B, or C on the punch/bender 19. Grippers 422 are most generally operated by a robotic/vision system. An embodiment of the grippers used in the three point plate registration system 22, grasps the plate as it moves onto the bed of the punch/bender 19 without assistance from an operator. For example, two grippers 422 may be used on each side of the plate. Grippers 422 close their hands on the plate and position the plate against pins 401A, B, or C under the direction of the vision system. Gripper 422 may also assist movement of the plate into and out of imager 18 and/or punch/bender 19. FIG. 6 illustrates the bed of a punch/bender 19, such as that described in U.S. Pat. No. 5,970,774. FIG. 6 illustrates two grippers 422 holding a plate on one side, cameras 403A and B, alignment marks 405A and B on the plate, and pins 401A, B, and C.

Although the apparatus for registration of an imaged lithographic plate with an imager, plate bender, and press cylinder, and the process thereof, have been described with reference to the embodiments, those skilled in the art will recognize that numerous changes may be made in form and detail without departing from the spirit and scope of the apparatus and process.

We claim:

1. An apparatus for registration of a lithographic plate, comprising:

(a) an imaging device having (i) one fixed registration pin for contact with a first edge of the plate, two fixed registration pins for contact with a second edge adjacent the first edge of the plate; (ii) an indicator means for indicating whether the plate is in contact with all three registration pins; (iii) a means for moving the plate in contact with all three registration pins; and (iv) a means for imparting an image, including a set of alignment marks, on the plate in register with the three fixed registration pins; and (b) a bending device having (i) one eccentric rotatable registration pin for contact with a first edge of the plate, two eccentric rotatable registration pins for contact with a second edge adjacent the first edge of the plate, the three eccentric rotatable registration pins disposed in target locations substantially the same as the relative locations of the fixed registration pins of the imaging device; (ii) an indicator means for indicating whether the plate is in contact with all three eccentric rotatable registration pins; (iii) a means for moving the plate in contact with all three eccentric rotatable registration pins so that the set of alignment marks become aligned with said target locations; and (iv) a means for punching and bending the imaged plate.

2. The apparatus of claim 1, comprising a first circuit means on the imaging device for indicating contact between the Lithographic plate and each of the fixed registration pins on the imaging device; a second circuit means on the bending device for indicating contact between the lithographic plate and each of the eccentric rotatable registration pins on the bending device; where the first circuit means includes a current source connected to the lithographic plate on the imaging device; where the second circuit means includes a current source connected to the lithographic plate on the bending device; and arranged such that a current flows through the first and second circuit means only when the plate is in contact with each of the respective pins of the imaging device or of the bending device.

3. The apparatus of claim 2 and further including a means in the second circuit means for detection of electrical contact between the plate and the three eccentric rotatable pins for generating a signal to initiate a bender operation.

4. The apparatus of claim 3, wherein if said electrical contact is not detected, a signal is generated to the bender to move the plate into contact with each of the three eccentric, rotatable pins.

5. The apparatus of claim 4, comprising robotic grippers to move the plate.

6. The apparatus of claim 5, comprising two robotic grippers on each side of the plate operating under the direction of a vision system.

7. The apparatus of claim 1, wherein the eccentrically rotatable pins of the bending device, when rotated, move the plate in register with specified tolerances of a press cylinder.

8. The apparatus of claim 7, wherein each of the three eccentric rotatable pins comprises a shaft offset from a central axis, an upper shall extension in line with the central axis, a drive means for rotating the shall and the upper extension of the shaft, whereby each pin is eccentrically rotated.

9. The apparatus of claim 8 where the alignment marks in registration with the fixed pins of the imaging device are indicative of a targeted plate position with respect to upper shaft extensions relative to an out of register plate position on the bed of the bending device.

10. The apparatus of claim 9, and further including one or more cameras for scanning the alignment marks, comparing the alignment marks to the targeted position, and indicating an in-register, or out of register, plate position when the target plate position is respectively inside, or outside, of the alignment marks.

11. The apparatus of claim 10, wherein each pin is moveable in clockwise or counter-clockwise rotation.

12. The apparatus of claim 11, wherein each pin is rotatable independently of the other pins.

13. The apparatus of claim 10, wherein a separate camera is provided for scanning each alignment mark.

14. The apparatus of claim 13, and further including a means for extending and retracting the pins above and below the bed of the bender.

15. An apparatus for registration of a lithographic plate, comprising a bending device having (i) one eccentric rotatable registration pin in contact with a first edge of the plate, two eccentric rotatable registration pins in contact with a second edge adjacent the first edge of the plate, the three eccentric rotatable registration pins in locations substantially the same as the relative locations of fixed registration pins of an Imaging device; (ii) a means for determining whether the position of the plate is in registration with a specified plate lock-up position on a press cylinder; (iii) a means for moving the plate into register by rotating the three eccentric registration pins until the plate is in register; and (iv) a means for punching and bending the imaged plate.

16. The apparatus of claim 1, wherein the bending device comprises a means for extending and retracting the three eccentric rotatable registration pins above and below a bed of the bending device.

* * * * *

UNITED STATES PATENT AND TRADEMARK OFFICE
CERTIFICATE OF CORRECTION

PATENT NO. : 7,621,219 B2
APPLICATION NO. : 11/752839
DATED : November 24, 2009
INVENTOR(S) : Dennis M. Burgess, William J. Campbell and Joseph A. Stein It is certified that error appears in the above-identified patent and that said Letters Patent is hereby corrected as shown below:

In Col. 8, line 24, "Lithographic" should be changed to "lithographic".

In Col. 8, line 54, "shall" should be changed to "shaft".

In Col. 8, line 55, "shall" should be changed to "shaft".

In Col. 10, line 3, "Imaging" should be changed to "imaging".

In Col. 10, line 9, "claim 1" should be changed to "claim 15".

Signed and Sealed this

Twelfth Day of January, 2010

David J. Kappos
*Director of the United States Patent and Trademark Office*